United States Patent
Tachibana

(10) Patent No.: US 7,182,208 B2
(45) Date of Patent: Feb. 27, 2007

(54) INSTRUMENT RACK WITH DIRECT EXHAUSTION

(75) Inventor: Junichi Tachibana, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 108 days.

(21) Appl. No.: 10/741,152

(22) Filed: Dec. 19, 2003

(65) Prior Publication Data

US 2004/0182799 A1  Sep. 23, 2004

(30) Foreign Application Priority Data

Dec. 20, 2002  (JP) .............................. 2002-370409

(51) Int. Cl.
*F25D 17/08* (2006.01)

(52) U.S. Cl. ........................................ 211/26; 361/694

(58) Field of Classification Search ................ 312/213, 312/36, 223.2, 236; 62/89; 361/695, 687, 361/692, 696; 165/47, 454, 168, 169; 454/185, 454/184; 211/26
See application file for complete search history.

(56) References Cited

U.S. PATENT DOCUMENTS

| | | | |
|---|---|---|---|
| 3,192,306 A | | 6/1965 | Skonnord .................... 174/16 |
| 4,528,614 A | | 7/1985 | Shariff et al. ................ 361/379 |
| 4,797,783 A | * | 1/1989 | Kohmoto et al. ........... 361/695 |
| 5,216,579 A | | 6/1993 | Basara et al. ............... 361/383 |
| 5,493,474 A | * | 2/1996 | Schkrohowsky et al. ... 361/695 |
| 5,782,546 A | * | 7/1998 | Iwatare ....................... 312/236 |
| 5,818,696 A | * | 10/1998 | Knoop ........................ 361/730 |
| 6,462,944 B1 | * | 10/2002 | Lin ............................. 361/687 |
| 6,463,997 B1 | * | 10/2002 | Nicolai et al. ............. 165/80.2 |
| 6,643,123 B2 | * | 11/2003 | Hartel et al. ................ 361/678 |
| 6,776,707 B2 | * | 8/2004 | Koplin ........................ 454/184 |
| 6,877,551 B2 | * | 4/2005 | Stoller .......................... 165/47 |

FOREIGN PATENT DOCUMENTS

| | | |
|---|---|---|
| DE | 1011936 | 2/1958 |
| DE | 2537295 | 4/1976 |
| DE | 3316978 | 11/1984 |
| DE | 29718687 | 1/1998 |
| DE | 19804902 | 8/1999 |
| DE | 19804905 | 8/1999 |
| DE | 20016013 | 12/2001 |
| DE | 10121759 | 11/2002 |
| DE | 10128367 | 1/2003 |
| EP | 1389900 | 2/2004 |
| FR | 2193303 | 2/1974 |
| JP | 62-174397 | 11/1987 |
| JP | 2000-277956 | 10/2000 |

* cited by examiner

*Primary Examiner*—Peter M. Cuomo
*Assistant Examiner*—Jared W. Newton

(57) ABSTRACT

A rack for holding on its inside multiple electronic devices, which have fans for drawing outside air to inside the devices and exhaust ports for discharging air, including two pairs of support columns, the columns of each pair being placed parallel to one another in the front and the back at a pre-determined distance apart from one another, and air ducts for directing exhaust air from the above-mentioned exhaust ports of these electronic devices positioned between at least one pair of the two pairs of support columns, having a structure wherein there are side covers that cover the side surfaces, and the air ducts are installed between the pair of support columns between the side covers and the inside of the rack and are substantially formed from multiple panels adjacent to one another inside of the rack.

6 Claims, 5 Drawing Sheets

INSTRUMENT RACK WITH DIRECT EXHAUSTION

BACKGROUND OF THE INVENTION

1. Field of the Invention

The present invention relates to a rack for electronic devices and equipments that generate heat and in particular to a low-cost instrument rack with high warm-air discharge efficiency.

2. Description of the Related Art

Many diverse electronic devices: personal computers, measuring instruments and others have been installed in places ranging from business offices to factories in recent years, and the environmental conditions under which each electronic device is used have become critical as a result. For instance, there are cases in which multiple electronic devices are mounted in vertical arrangements inside a rack for mounting equipment for the purpose of efficient use of room space.

Electronic devices for this type of rack mount are generally equipped with fans that cool each electronic device because when the temperature of each electronic component in the device housing increases too much due to the emission of heat, problems occur in that degradation of the electronic component takes place, and further, its service life is curtailed.

In the past, an instrument rack comprising a rack for mounting devices having two frames (four support columns) arranged parallel to one another in the longitudinal direction at a pre-determined interval and multiple individual electronic devices with fans attached mounted on the frames of this rack lined up in a row in the vertical direction has been used for this type of instrument rack.

The covers (front door, back door, side covers, etc.) that are normally attached to the rack are removed and the heat from the electronic devices inside the rack is released to outside of the rack with this type of instrument rack.

Nevertheless, this type of rack is awkward to look at, foreign matter easily enters the inside of the rack, and the heat generated is uncomfortable to users of equipment near the rack. Moreover, when several racks of this type are lined up close to one another, heat is exchanged between the adjacent racks and this leads to an abnormal increase in temperature of the mounted electronic devices.

Therefore, holes that lead to the inside of the rack are made in the top of racks with a cover and the hot air from the electronic devices rises from the bottom of the rack and flows outside the rack through these holes.

Nevertheless, there are problems with this method in that the rise of air as a result of natural convection is weak and the amount of air that can be discharged to outside the rack is insufficient. In addition, the convection of air is disturbed by agitation of the air inside the rack by the fans of the electronic devices and this also reduces heat discharge efficiency. Furthermore, there is a problem in that if electronic devices that reach a high temperature are placed at the bottom of the rack, the electronic devices at the top inside the rack will be exposed to air that is hotter and therefore, placement of the electronic devices is difficult.

Therefore, additional fans are attached to the holes in the top in order to force the air to rise and the hot air inside the rack is thereby suctioned and discharged under force. By means of this method, the amount of heat that can be discharged increases in proportion to the capability of the additional fans, but electricity is needed to drive the fans, and a problem develops as a result of the noise generated by the fans. Furthermore, if the additional fans break down, the temperature inside the rack will rise and all of the electronic devices mounted inside the rack will be exposed to the risk of breakdown. Furthermore, there is also a problem in that it is difficult, of course, to arrange the electronic devices for an efficient discharge of heat.

Technology wherein the heat that is discharged from one electronic device does not affect the other electronic devices has been developed as a technology that facilitates the placement of electronic devices (for instance, reference to Patent Reference 1). By means of the technology cited in Patent Reference 1, air from each electronic device is discharged by duct 34, which is formed from inside wall 26 of housing 20 and side surface 6 of unit (electronic device) 4 (or, by blind patch 33 placed where there are no electronic devices), and the warm air that has been discharged is forced outside the device by fan 25 placed at the top of housing 20. On the other hand, cold air from intake port 23 at the bottom of housing 20 is introduced to inside unit 4 by fan 7 of unit 4, passes through unit 4, and is discharged through duct 34. Fan 7 is placed on the side of side surface 12 that faces side surface 6.

In addition, technology has been developed in which the electronic devices mounted on a rack are cooled by natural cooling without attaching any additional fans to the rack (for instance, refer to Patent Reference 2). By means of the technology cited in Patent Reference 2, fans of the electronic devices draw air inside the electronic devices through the air inflow port on the front surface of the rack and this air is discharged by the fan to air ducts outside the electronic devices. Air ducts inside the rack are placed at each electronic device so that the fans are enclosed by the sides of the rack and discharge from the fans is directed to the back surface, which is open at the openings in the top of the rack.

By means of this technology, there is no mixing of discharge air and intake air between electronic devices at the top and bottom. Therefore, it is not necessary to place a cover between the electronic devices at the top and those at the bottom and discharge efficiency can be increased. In addition, it is not necessary to form a path for cooling between the electronic devices at the top and those at the bottom, so that the rack dimensions can be reduced in the direction of height and miniaturization of the overall structure can be anticipated. In addition, by applying a sound-absorbing member inside the air duct, it is possible to partially absorb and thereby attenuate some of the noise generated by the exhaust air from the fan. Furthermore, technology is also disclosed in Patent Reference 2 whereby air inflow ports and air outflow ports that open up inside and outside the housing of the electronic devices are set up and in these, the air channel ports of the air ducts communicate with the air inflow ports. In this case, after the exhaust air from the air ducts has flowed from the air inflow port of the housing into the electronic devices, it flows out again from the air outflow ports of the housing to outside the rack and therefore, the distance for which the exhaust air from the fan passes through the rack is increased and the noise from the exhaust air can be more efficiently attenuated.

There are problems with the prior technology cited in Patent Reference 1 in that although there is no mixing of intake air and discharge air, since fans for forced air cooling are installed, the suctioning of air is restricted to the bottom of the housing, and there are restrictions to the size and direction of the electronic devices, and the like.

There are also problems with the instrument rack cited in Patent Reference 2 in which additional fans for forced air cooling of the rack are not installed. That is, air ducts with a relatively complex structure are set up inside the rack and therefore, cost is high, and the space inside the rack that is used for discharge is also limited. Moreover, exhaust air leaks and enters inside the rack from the connecting parts between the air ducts and the electronic devices and it is necessary to design the connecting parts to match the dimensions of the electronic devices.

[Patent Reference 1]

Official gazette of laying open for the Japanese Utility Model Application No. Showa 62(1987)-174,397 (line 2, page 5 through line 16, page 6; FIGS. 1 and 3).

[Patent Reference 2]

Official gazette of Japanese Patent Application laying open No. 2000-277,956 (sections 0015 through 0037, FIGS. 1 and 2)

SUMMARY OF THE INVENTION

The present invention is created in light of these foregoing conditions, its object being to improve an instrument rack with which air ducts are placed between the front and back support columns of the rack, the heat discharge efficiency of the electronic devices is improved at a low cost, and the degree of freedom in terms of the size of the rack and placement of electronic devices in the rack is increased.

In order to accomplish the above-mentioned object, the instrument rack of the present invention has a structure in which a rack for holding on its inside multiple electronic devices having intake ports for drawing outside air to inside the devices, exhaust ports for discharging air to outside the devices, and fans, comprising two pairs of support columns, the columns of each pair being placed parallel to one another in the front and the back at a pre-determined distance apart from one another, and with which air ducts for guiding the exhaust air from said exhaust port of each electronic device are positioned between at least one pair of the two support columns.

The instrument rack further has side covers that cover the side surfaces, and the above-mentioned air ducts are installed between the pair of support columns between the side covers and the inside of the rack and are substantially formed from multiple panels inside the rack.

Consequently, the side covers that are usually installed are efficiently used and cost is reduced. Moreover, the space that can be used for discharge is also increased. There are many cases in which only relatively simple panels need to be replaced in accordance with each electronic device and therefore, there is a greater degree of freedom in terms of selecting the electronic devices.

The invention herein is a structure in which, by means of the instrument rack, air ducts are positioned between each of the two pairs of support columns. Consequently, the effective cross section of the air ducts is increased and heat discharge efficiency is also increased. Moreover, electronic devices with exhaust ports on any side can be mounted and therefore, power consumption by electronic devices with exhaust ports on both sides is greatly reduced.

The invention cited herein has a structure in which, by means of the instrument rack with direct exhaustion, there are further telescopic exhaust air ducts between the above-mentioned air exhaust ports and the air ducts in order to guide exhaust air from the exhaust ports to the above-mentioned air ducts. Consequently, differences in the positions of the exhaust ports depending on the electronic device can be assimilated, and therefore, the types of electronic devices that can be mounted without replacing panels that are not needed to adjust each electronic device is increased.

The invention herein has a structure in which, by means of the instrument rack with direct exhaustion, the exhaust air ducts have packings enclosing the exhaust ports and are joined with the electronic devices by the packings. Consequently, the leakage of exhaust air inside the rack is minimized due to these packings and exhaust air can be more efficiently channeled to the air ducts.

The invention herein has a structure in which, by means of the instrument rack with direct exhaustion, there are the mentioned exhaust air ducts only at the panels that are adjacent to the exhaust ports of the electronic devices. Consequently, the other panels can be flank panels (flat panels) and therefore, they are inexpensive and it is easy to reduce leakage from the air ducts.

The invention disclosed herein has a structure in which, by means of the instrument rack with direct exhaustion, the air channel ports of the air ducts are open at the top of the rack. Consequently, the air that has been discharged to the air ducts is more efficiently discharged due to a funnel effect.

The invention herein has a structure in which, by means of the instrument rack with direct exhaustion, the air channel ports of the air ducts are open at the top of the rack and at the back surface of the rack. Consequently, the air in the air ducts can be efficiently discharged without moving to the adjacent racks.

The invention herein is the instrument rack with direct exhaustion, wherein the air ducts are positioned on each side surface of the rack. Consequently, discharge is performed by two air ducts and the heat discharge efficiency is improved, and the exhaust ports of the electronic devices can be on either of the side panels, increasing the degree of freedom in terms of selection and placement of the electronic devices.

The invention herein has a structure in which, by means of the instrument rack with direct exhaustion, the rack has two side covers, a front door, and a back door. Consequently, foreign matter will not enter from the outside and an instrument rack is obtained that is pleasant to look at and with which there is little thermal interference with adjacent racks. Moreover, if the above-mentioned side covers and front and back doors are made from a conductive material, unnecessary electromagnetic radiation from the racks can be easily reduced. For this reason as well, there is little electromagnetic interference with adjacent racks.

The invention herein has a structure in which, by means of the instrument rack with direct exhaustion, sound absorbing members are attached to the inside of the air ducts. Consequently, the noise from the fans can be further reduced.

The invention herein has a structure in which, by means of the instrument rack with direct exhaustion, the rack does not have additional fans for forced discharge of the exhaust air inside the air ducts to outside the rack. Consequently, equipment for monitoring fan operation or reporting anomalies is not necessary and there is no anomalous rise in the temperature inside the rack due to breakdown of additional fans. Of course, power for driving the fans is also not necessary. Furthermore, there are no additional fans or electromagnetic radiation through additional fans, so that this solution is effective in reducing unwanted electromagnetic radiation from the rack.

The invention herein has a structure in which, by means of the instrument rack with direct exhaustion, the electronic devices have intake ports that are different from the exhaust ports and the outside air is drawn from the intake ports by the fans of the intake ports. Consequently, the distance from the fans to the exhaust ports is increased and the amount of noise from the exhaust of the air ducts of the fans is reduced.

Furthermore, the invention herein has a structure in which, by means of the instrument rack with direct exhaustion structure, the user can select from and install panels having dimensions in the vertical direction that are an integral multiple of the unit length such as one, two, or four times a pre-determined unit length, for instance, 44.45 millimeters. Thus, it is possible to house electronic devices of various dimensions and to perform efficient discharge.

The invention herein of the present invention has a structure in which a rack for holding on its inside multiple electronic devices, which have intake ports for drawing outside air to inside the devices, exhaust ports for discharging air to outside the devices, and fans, comprising two pairs of support columns, the columns of each pair being placed parallel to one another in the front and the back at a pre-determined distance apart from one another, and with which air ducts for guiding the exhaust air from said exhaust port of each electronic device are positioned between at least one pair of said two support columns. The rack further has side covers that cover the side surfaces, the above-mentioned air ducts are installed between the above-mentioned pair of support columns between the above-mentioned side covers and the inside of the above-mentioned rack and are substantially formed from multiple panels inside the above-mentioned rack, those ducts comprised of the above-mentioned multiple panels facing the exhaust ports of the electronic devices having an opening and those ducts comprised of the above-mentioned multiple panels facing the intake ports of the electronic devices not having an opening, and there is a space between the above-mentioned panels and the above-mentioned intake ports so that air can flow in from the above-mentioned intake ports and air is discharged from the above-mentioned openings through the above-mentioned air ducts.

It should be noted that by means of the present invention, support columns and angles are used in addition to side covers and panels in order to form the air duct, but the effect of controlling the exhaust air that passes through the inside of the air duct is relatively small when compared to the side covers and panels, and embodiments wherein this effect can be all but disregarded are also possible. In this sense, the phrase "the side covers and panels substantially form the air ducts" is used.

DETAILED DESCRIPTION OF THE INVENTION

Figure 1:
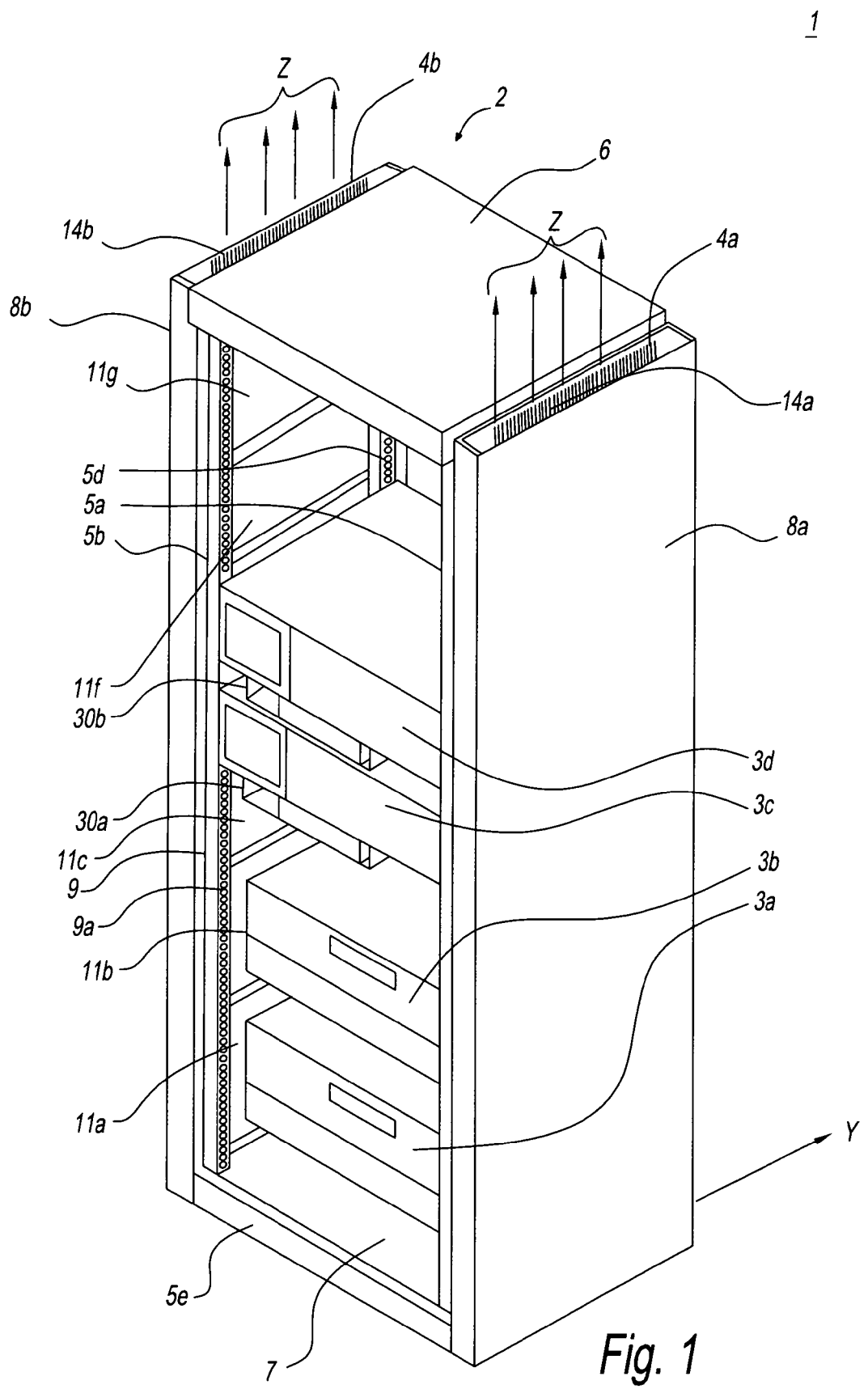
FIG. 1 is a perspective view showing the instrument rack of an embodiment of the present invention from the front side.
Figure 2:
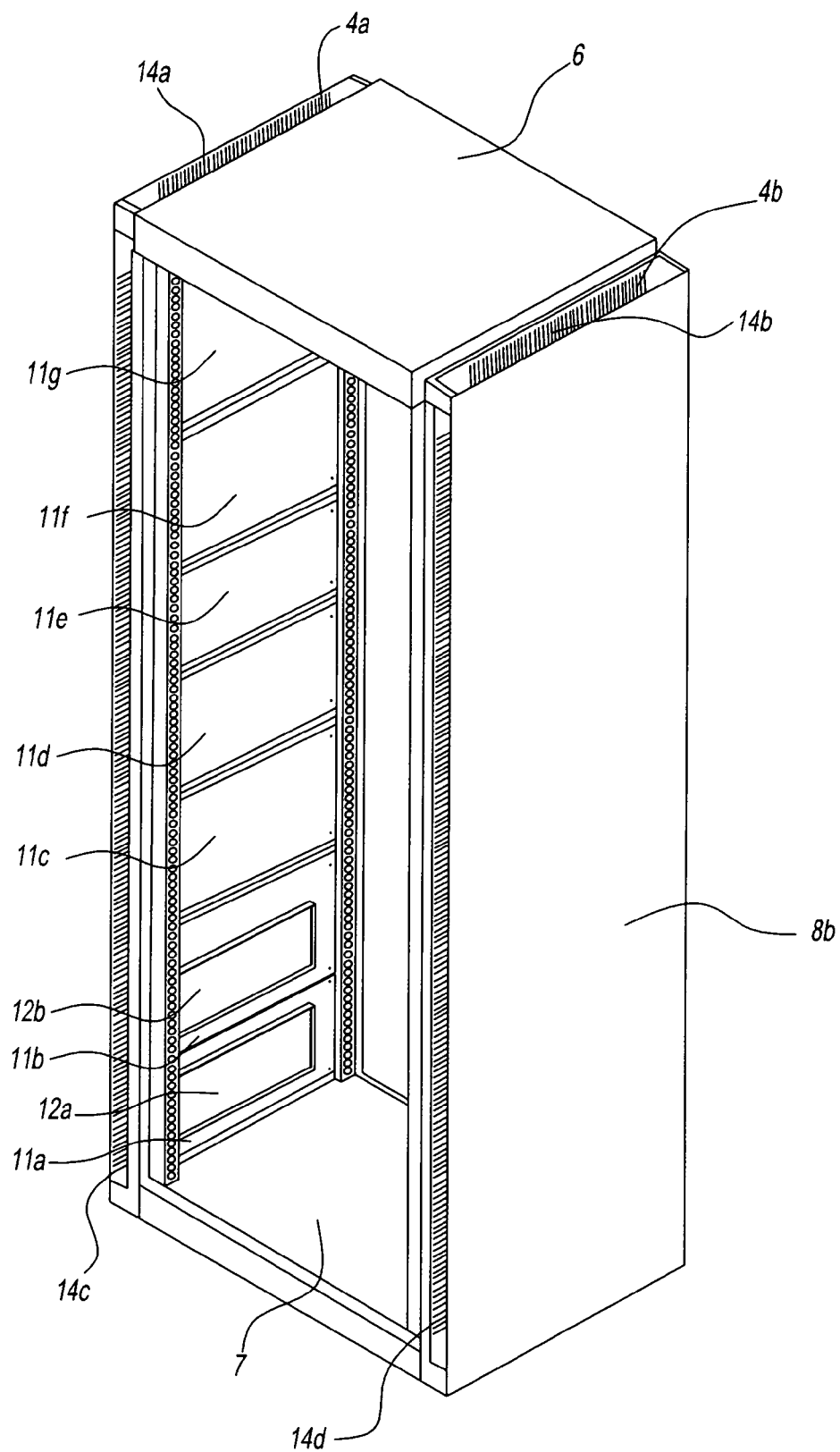
FIG. 2 is a perspective view showing the inside of the instrument rack of an embodiment of the present invention from the back side.

Embodiments of the present invention are described below while referring to the drawings. FIG. 1 is an oblique view showing the instrument rack of one embodiment of the present invention and shows the state where the electronic devices are mounted and the front door is removed to see inside. FIG. 2 is an oblique view showing the same instrument rack of one embodiment of the present invention in the same state as in FIG. 1, but it is a drawing seen from the back with the mounted electronic devices removed. The entire unit, including the electronic devices represented by symbol 1, in FIGS. 1 and 2 comprises the instrument rack (referred to below as the "rack") having air ducts 4 and electronic devices 3.

Rack 2 in FIGS. 1 and 2 has support columns 5 (5a, 5b, 5c (not illustrated), 5d), top plate 6, base plate 7, and side covers 8 (8a, 8b), and preferably the entire unit is formed to meet standard dimensions. It should be noted that the side covers form the sides of air ducts 4 (4a, 4b) and that the air that is discharged to the air ducts by the fans of electronic devices 3 is discharged from opening 14 (14a, 14b) made extending to the top of air ducts 4 to outside the rack in the direction of arrows Z. Opening 14 is preferably a group of many small holes. Side covers 8 are placed with the same openings 14c and 14d extending to the back surface of rack 2 and can thereby raise the discharge efficiency. Consequently, it is also possible to discharge exhaust air from air duct 4 in direction Y at the back surface of the rack with this type of structure. Foreign matter can be easily prevented from penetrating openings 14 by making openings 14 groups of many small holes and therefore, this also has an effect in terms of safety.

Support columns 5 comprise one pair of front support columns 5a and 5b, each of which are placed parallel to one another on the left and the right at a pre-determined distance apart from one another, and one pair of back support columns 5c and 5d (back support column 5c is not illustrated), each of which are placed parallel to the respective front support column 5a and 5b at a pre-determined distance apart from one another. They are placed standing on base plate 7. With the exception of details, such as screw holes, and the like, support columns 5a through 5d can have the same cross section, for instance, an Ω-shape with 5 sides. They have two foot parts, two leg parts, and one head part. They are placed so that the heads of the front support columns face one another and the heads of the back support columns face one another, with the foot parts toward the outside of the rack.

The top side beams (not illustrated) that connect front support columns 5a and 5b and back support columns 5c and 5d at the top are supported at the top end of support column 5. The bottom side beams (only bottom beams 5e is illustrated) that connect front support columns 5a and 5b and back support columns 5c and 5d at the bottom are supported at the bottom end of support column 5. Top plate 6 is placed at the top of rack 2 and is fastened to the top side beam. Base plate 7 is placed at the bottom of rack 2 and is fastened to bottom side beam 5e. Side covers 8 are positioned on both sides of rack 2 and are fastened to support columns 5a through 5d and side beam 5e, etc. Side covers 8 can also be fastened to support columns 5.

Fastener parts 9 having many screw holes or through holes 9a, and the like are made in a vertical row at pre-determined distances in each support column 5a through 5d. Thus, multiple electronic devices 3 and panels 11 (11a through 11g) are fastened at specific intervals running up and down the rack to support columns 5 of rack 2. It should be noted that the conventional fastening angles for fastening electronic devices 3 to support columns 5 are omitted in FIG. 1.

As shown in FIG. 1, support column 5 with an Ω-shaped cross section has foot parts that project between the support columns at the side of the rack. When one of these foot parts has a second fastener part (not illustrated) for fastening to the side surface, panels 11 can be fastened to this second fastener part. Electronic devices are fastened to the support columns by the head part of the Ω shaped cross section. Thus, it is possible to make the space between the electronic devices and panel 11 wider. Panels 11 are described as being the same type as used for side covers 8a and 8b, but it is obvious that the effects of the present invention can be realized with other types of panels.

The same results can be realized even if support columns 5 do not have this type of projecting part because L-shaped angles are attached to the back surface fastener parts of support columns 5 and panels 11 are fastened to fastener parts at the leg parts of the angles, which are different from the attachment parts.

When each cross section of support columns 5a through 5d is a shape in which one projecting foot part is missing, the support columns are positioned so that the head parts of the front support columns and the back support columns face the side surfaces of the rack from opposing directions. Moreover, the electronic devices are fastened using an angle to the leg part that is missing this foot part and panel 11 is fastened to the foot part. The leg part with the foot part preferably comprises part of the wall of air duct 4 without holes. Thus, the cross section of the air duct can be enlarged.

When the electronic devices are standardized, panel 11 can be present in only two types, square blank panels and panels with exhaust ducts that are the same length (dimension in the horizontal direction when mounted on the rack) and the same width (dimension in the vertical direction when mounted on the rack). Several types of panels that come in widths that are a multiple of the standardized height of the electronic devices can also be used. For instance, in the examples, when 1 unit is 44.45 millimeters based on EIA standards, panels whose dimensions are 1 unit, 2 units and 4 units are each used. Thus, the appropriate panel should be selected and attached in accordance with the height of the electronic devices that are being housed. In another example, many panels of two types (with and without ducts) of a minimum standardized height are used. Thus, the examples of the present invention are easy to handle and inexpensive.

When the sides of adjacent panels 11 are fastened together, it is necessary to take into consideration the width of panels 11 and the allowance corresponding to the worked precision of the fastener holes. Therefore, there are cases where spaces are formed between adjacent panels 11. In general, there are many cases in which these spaces are small enough that there is no major deterioration of exhaust capability of the air ducts. When there is a need to fill in these spaces, a soft edge can be made on one or both of the bottom and top sides of panels 11 in order to fill in these spaces. The simplest thing is to fasten the top and bottom sides of adjacent panels to support columns 5 so that they overlap one another. The air in the air duct will rise and therefore, it is preferred that the bottom side of the top panels overlap the top side of the adjacent bottom panel from the inside of the rack. Thus, the bottom sides of the panels should be worked so that they will move horizontally by a distance that corresponds to the panel thickness of a dimension of several mm to 1 cm.

Of panels 11, panels 11c through 11g that do not face the exhaust ports of the electronic devices are blank panels (panels that have no holes other than fastener holes). On the other hand, panels 11a and 11b that face the exhaust ports have exhaust ducts 12a and 12b, respectively, which are connected to the exhaust ports. The bases of exhaust ducts 12a and 12b are anchored in place by being fastened to the openings in panels 11a and 11b and the top parts of exhaust ducts 12a and 12b are connected to the exhaust ports so that they can be disconnected again as needed. The side of the electronic devices without fans generally faces a blank panel, but when this side is the same side as the exhaust port, it should face a panel with an exhaust duct.

Each panel 11 is preferably fastened to support column 5 using a latch-type fastener. Consequently, it is possible to attach and detach panel 11 manually without using tools. Of course, the remaining results of the present invention are obtained also when the panels are fastened with screws.

As shown in FIG. 1, air duct 4a is made so that it is substantially formed by side cover 8a and panels 11a through 11g and exhaust air from electronic devices 3a and 3b that has entered from the exhaust port through exhaust ducts 12a and 12b, shown in FIG. 2, is discharged through openings 14a and 14c to outside the rack. The same effects are obtained when air duct 4b at the side of side cover 8b has the same structure as air duct 4a, as shown in FIG. 2.

Electronic device group 3 comprises multiple electronic devices 3a, 3b, 3c, and 3d that are lined up in a vertical row and is housed mounted inside rack 2 using mounting tools 30a and 30b and fastening angles (not illustrated), and is anchored to top support columns 5a and 5b. These electronic devices have intake ports and exhaust ports for air on the side of the side covers. The case in which electronic devices 3a and 3b have exhaust ports on the side of side cover 8a will be described. It should be noted that the vertical placement of the electronic devices is not limited to what is illustrated.

Electronic devices 3a and 3b have a cooling fan on the side of the exhaust port to the left in the figure. Moreover, it is also possible for a fan to draw air inside the rack through an intake port with an appropriate filter into electronic devices 3a and 3b and discharge the air through the exhaust port without placing a fan at the exhaust port. The air inside the rack is drawn from outside rack 2 through small spaces 8ca, 8da, and the like of front door 8c and rear door 8d. There is sufficient space made between the panels on the side of the intake ports of electronic devices 3a and 3b and the intake ports, and therefore, air is drawn through these spaces to the intake ports. By means of the structure of the invention, air inside the rack is released through front door 8c and does not bother the user of the electronic devices. The exhaust ports (with a fan or without a fan) of electronic devices 3a and 3b are joined to the exhaust ducts at panels 11a and 11b.

It should be noted that the exhaust ports of the electronic devices can be on the left side or the right side of the drawings, and the panels facing the exhaust ports should be the panels with openings and the panels not facing the exhaust ports should be the blank panels.

Figure 3:
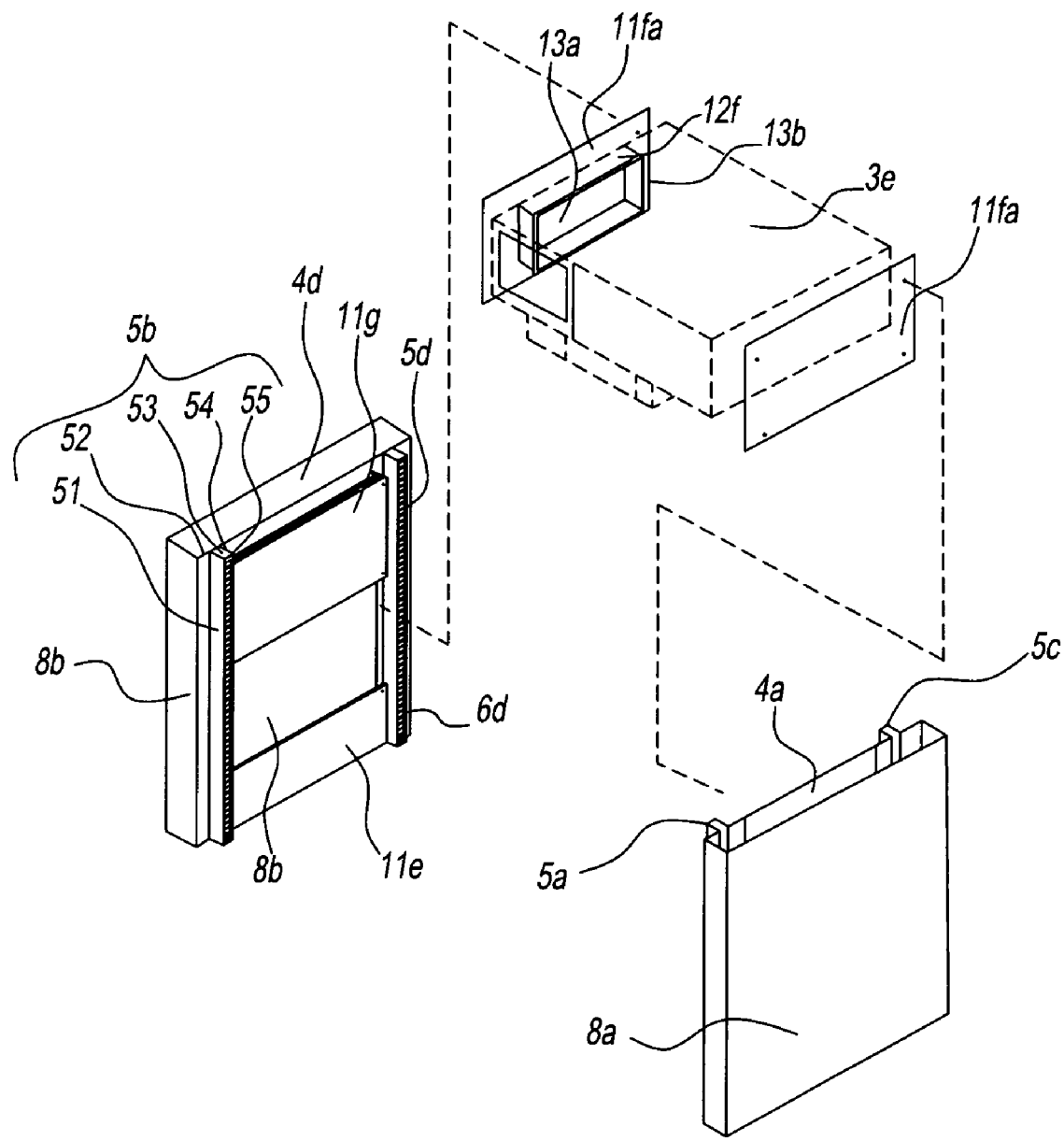
FIG. 3 is a perspective view showing the instrument rack of an embodiment of the present invention from the front side.

An example of electronic device 3e newly mounted in rack 2 will be described using FIG. 3. FIG. 3 is an oblique view of the structure in FIG. 1 cut into two horizontal planes and includes the segment from part of panel 11e to part of panel 11g. Electronic device 3e is mounted and has an exhaust port at the surface that faces the side of rack 2. Support columns 5a through 5d will be described as having an Ω-shaped cross section. It should be noted that this cross section can have a variety of shapes in accordance with the object of the present invention. Although support columns 5a through 5d have the same cross section, only support column 5b will be described. The cross section of support column 5b is Ω-shaped and in accordance with this cross section, the support column has a first foot part 52 and a second foot part 54, first and second leg parts 51 and 55, and a head part 53. Side cover 8b can be fastened to foot part 52, or it can simply be fastened to the side wood piece at the top or the bottom of the support column so that the foot part is covered by the side cover.

First, panels 11f, which are flat sheets without exhaust ducts and correspond to the position where electronic device 3e should be mounted, are removed. Next, panels 11fa with exhaust ducts 12f are instead attached between support columns 5a and 5c and support columns 5b and 5d, respectively, of the rack using screws, or preferably latch-type fasteners. The base of exhaust duct 12f is screwed into place or adhered to panel 11fa so that opening 13a in panel 11fa is enclosed inside exhaust duct 12f.

The head part of exhaust duct 12f encloses the exhaust port of electronic device 3e fitting closely to the side of electronic device 3e so that all of the exhaust air from this exhaust port is drawn into the exhaust duct. In order to make this fit tighter and reduce the leakage of exhaust air into the rack, flexible packing 13b made of rubber or plastic can be fastened to the head part of exhaust duct 12f. Packing 13b can absorbs slips in position in the horizontal direction of electronic device 3e, and therefore, it provides the effect of easily being able to use exhaust duct 12f with electronic devices of different sizes in the horizontal direction. Furthermore, using an exhaust duct 12f that is bellows-shaped can also further increase the degree of freedom in the direction of length. Moreover, electronic devices of different widths can be easily accommodated by applying spring force to the bellows-shaped exhaust duct in the direction in which it expands by means of a coil spring, and the like.

It is also possible to use an exhaust duct with a simple closed chimney shape. In addition, a structure where the exhaust duct is joined to the fan at the exhaust port of the electronic device is preferred in order to standardize the exhaust duct design and simplify miniaturization.

Figure 4:
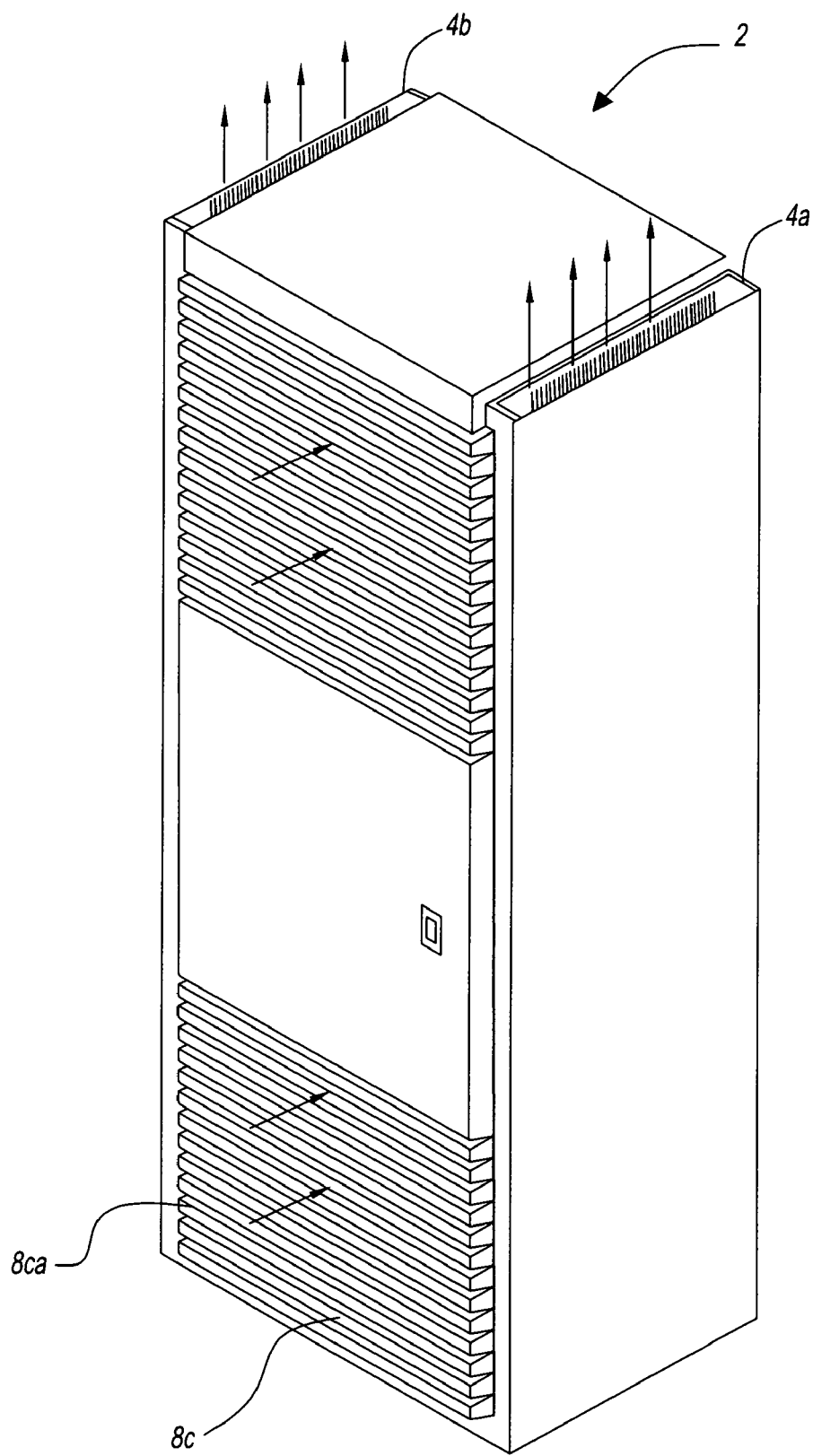
FIG. 4 is a perspective view showing the instrument rack of an embodiment of the present invention from the front side.
Figure 5:
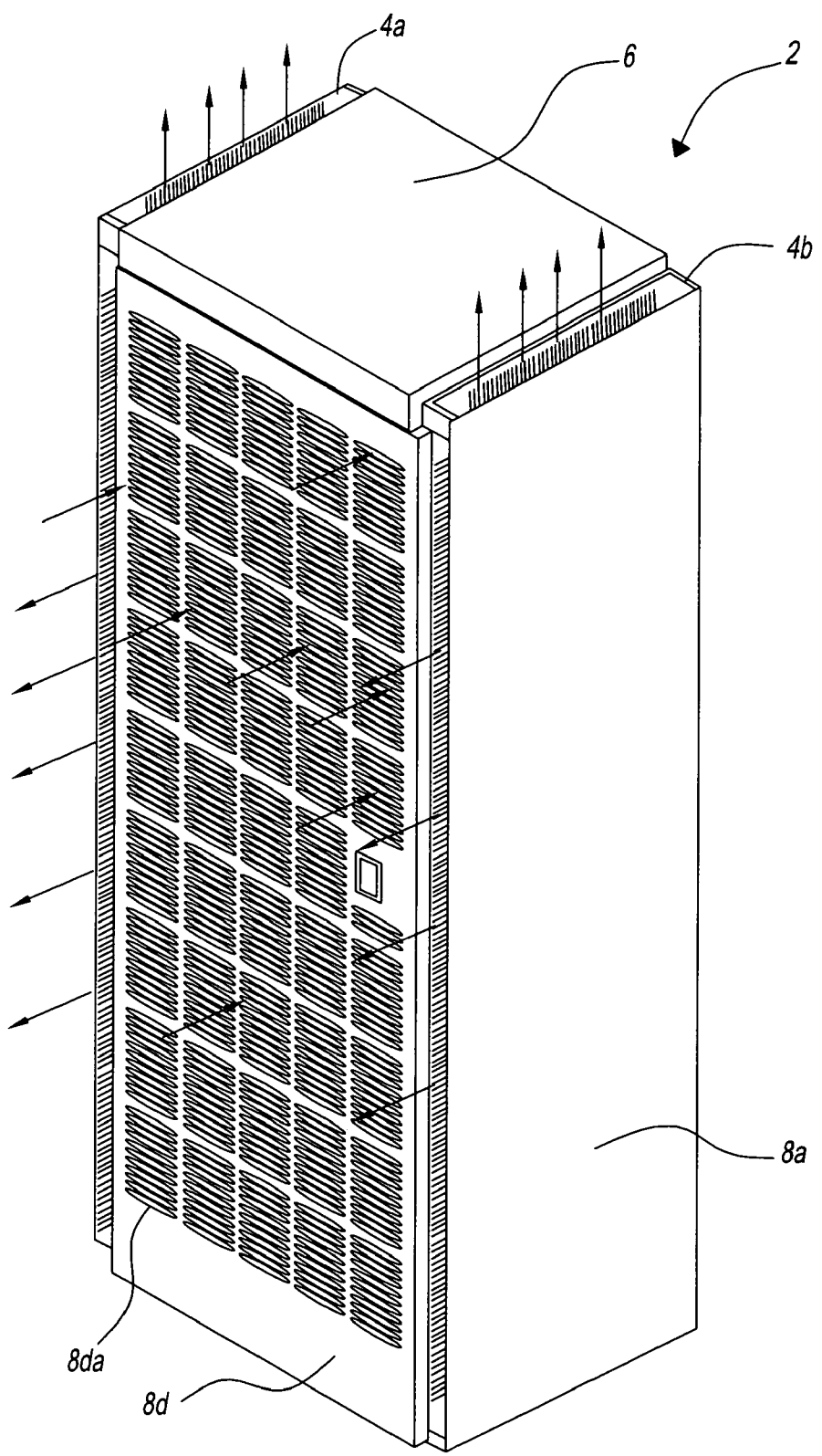
FIG. 5 is a perspective view showing the instrument rack of an embodiment of the present invention from the back side.

FIGS. 4 and 5 are oblique views seen from outside rack 2 of the instrument rack of the present invention with front door 8c and back door 8d. Front door 8c is shown in FIG. 4. It has a structure with many long small spaces 8ca that join the inside and the outside of the rack so that outside air is drawn into the rack. Moreover, back door 8d is shown in FIG. 5. It has a structure with many short small spaces 8da that join the inside and the outside of the rack so that outside air can also be drawn into the rack. The arrows in FIGS. 4 and 5 show the direction in which air flows.

Side covers 8a and 8b, front door 8c, back door 8d, and the like can be made from an insulator, such as plastic, etc., but if they are made from a conductor, unwanted electromagnetic energy that radiates from rack 2 of cooled structure 1 to the environment is reduced.

It should be noted that the case in which each air duct 4a and 4b is common to all electronic devices was described, but each individual electronic device or groups of electronic devices can also be discharged by bending the top side of panel 11 to inside the air duct and setting up partitions in panel 11 so that exhaust air is discharged to openings 14c and 14d in the back surface.

Moreover, as seen with the prior art, it is also possible to fasten small additional fans to some of openings 14a through 14d. In this case, a structure is made with which the effect of the additional fan is felt only by specific electronic devices (groups) by allocating openings to each electronic device, as previously explained, and therefore, it is possible to alleviate the disrupting effect of the fans.

Furthermore, because it is not necessary to form the conventional air flow path (path for cooling) between electronic devices 3a and 3b by this embodiment, the rack dimensions can be reduced in the direction of length.

It should also be noted that this embodiment describes the case where air duct 4 simply functions as a unit that serves to guide exhaust air from the exhaust port to outside rack 2. However, the present invention is not limited to this embodiment and it is also possible to absorb part of the noise generated by the exhaust air by affixing a sound-absorbing member (not illustrated) inside air duct 4, as with the prior art.

In summary, by means of the present invention, air ducts for guiding exhaust air from each electronic device to outside the rack are positioned between both the front and the back support columns, and therefore, when each fan draws outside air to inside the devices, this air passes through these devices, and exhaust air is discharged to outside the devices, so that this exhaust air is directed to outside the rack by air ducts without entering inside the rack.

Consequently, there are no paths for air inside the device as there are with the prior art, and there is little increase in the temperature of mounted electronic devices. When forced cooling is performed using a conventional fan of the prior art, the increase in temperature inside the rack versus the outside temperature is only 10° C. and only 1.2 kW can be accommodated, but even when 1.6 kW is accommodated by the present invention, this rise in temperature is only 7° C.

What is claimed is:

1. An instrument rack with air exhaustion, for holding therein multiple electronic devices that have intake ports for drawing outside air inside of the devices, exhaust ports for discharging air outside of the devices, and fans, said rack comprising:
   two pairs of support columns, columns of each pair being placed parallel to one another in a front and in a back of said rack at a pre-determined distance apart from one another;
   air ducts, for guiding exhaust air from said exhaust port of each electronic device, positioned between at least one pair of said two pairs of support columns; and
   side covers that cover side surfaces of said rack,
   wherein said air ducts are substantially formed from multiple panels inside said rack, and
   wherein said air ducts are installed between said at least one pair of support columns and between said side covers and an inside of said rack, and form an air passage between said multiple panels and said side covers to an exterior of said instrument rack, and
   wherein said air channel port of said air ducts are open at the top of the rack and at the back surface of said rack.

2. The instrument rack according to claims 1, wherein said air ducts are each positioned on side surface of said rack.

3. The instrument rack according to claim 1, wherein said rack has two side covers, a front door, and a back door.

4. The instrument rack according to claim 1, wherein said rack does not have an additional fan for forced discharge of said exhaust air inside said air ducts.

5. The instrument rack according to claim 1, wherein panels can be selectively installed in said rack, said panels having dimensions in the vertical direction that are an integral multiple of a predetermined unit length.

6. The instrument rack according to claim 5, wherein said predetermined unit length is 44.45 millimeters.

* * * * *